United States Patent
Chuang et al.

(10) Patent No.: US 8,325,512 B2
(45) Date of Patent: Dec. 4, 2012

(54) SRAM WRITING SYSTEM AND RELATED APPARATUS

(75) Inventors: Ching-Te Chuang, Taipei County (TW); Wei-Chiang Shih, Taipei (TW); Hung-Yu Lee, Pingtung County (TW); Jihi-Yu Lin, Kaohsiung County (TW); Ming-Hsien Tu, Tainan (TW); Shyh-Jye Jou, Hsinchu County (TW); Kun-Di Lee, Hsinchu County (TW)

(73) Assignee: Faraday Technology Corp., Hsin-Chu (TW)

( * ) Notice: Subject to any disclaimer, the term of this patent is extended or adjusted under 35 U.S.C. 154(b) by 132 days.

(21) Appl. No.: 13/070,977

(22) Filed: Mar. 24, 2011

(65) Prior Publication Data
US 2011/0235444 A1 Sep. 29, 2011

(30) Foreign Application Priority Data

Mar. 25, 2010 (TW) .................................. 99108935

(51) Int. Cl.
*G11C 11/00* (2006.01)
(52) U.S. Cl. ................ 365/154; 365/189.11; 365/189.14
(58) Field of Classification Search .................. 365/154, 365/156, 189.14, 189.15, 189.16, 189.11, 365/230.05, 233.19
See application file for complete search history.

(56) References Cited

U.S. PATENT DOCUMENTS

2007/0279966 A1* 12/2007 Houston ........................ 365/154
2011/0085364 A1* 4/2011 Shimano et al. ............ 365/49.17
2011/0188327 A1* 8/2011 Ishikura et al. .......... 365/189.15

OTHER PUBLICATIONS

S. Mukhopadhyay; R. Rao; J.J. Kim; C.T. Chuang, Capacitive Coupling Based Transient Negative Bit-line Voltage (Tran-NBL) Scheme for Improving Write-ability of SRAM Design in Nanometer Technologies, 2008, p. 384-387, ECE Dept, Georgia Institute of Technology, Atlanta, GA; IBM T. J. Watson Research Center, Yorktown Heights, NY.
D.P. Wang; H.J.Liao; H. Yamauchi; Y.H Chen; Y.L. Lin; S.H Lin; D.C. Liu; H.C. Chang; W. Hwang, A 45nm Dual-Port SRAM with Write and Read Capability Enhancement at Low Voltage, 2007, p. 211-214, Institute of EE, National Chiao-Tung University; TSMC Hsinchu, Taiwan; Fukuoka Institute of Technology.

(Continued)

*Primary Examiner* — Richard Elms
*Assistant Examiner* — Hien Nguyen
(74) *Attorney, Agent, or Firm* — Winston Hsu; Scott Margo

(57) ABSTRACT

SRAM writing system and related apparatus are provided. The writing system of the invention has a dummy replica writing circuit, a negative pulse controller and at least a normal writing circuit; each normal writing circuit includes a write driver and a negative pulse supplier. While writing, the dummy replica writing circuit drives a dummy replica bit-line, such that the negative pulse controller generates a negative pulse control signal according to level of the dummy replica bit-line. In each writing circuit, when the write driver conducts to connect an associated bit-line to a bias end for driving a level transition, the negative pulse supplier switches the bias end from an operation voltage to a different negative pulse voltage according to the received negative pulse control signal.

16 Claims, 8 Drawing Sheets

OTHER PUBLICATIONS

K. Nii, M. Yabuuchi; Y. Tsukamoto; S. Ohbayashi; V. Oda, K. Usui; T. Kawamura; N. Tsuboi; T. Iwasaki; K. Hashimoto; H. Makino; H. Shinohara, A 45-nm Single-port and Dual-port SRAM family with Robust Read/Write Stabilizing Circuitry under DVFS Environment, 2008, p. 212-213, Renesas Technology Corporation, †Shikino High-Tech Corporation, Daioh Electric Corporation, Japan.

M. Yabuuchi; K. Nii; Y. Tsukamoto; S. Ohbayashi; Y. Nakase; H. Shinohara, A 45nm 0.6V Cross-Point 8T SRAM with Negative Biased Read/Write Assist, 2009, p. 158-159, Renesas Technology Corp., 4-1, Mizuhara, Itami, Hyogo, Japan.

* cited by examiner

SRAM WRITING SYSTEM AND RELATED APPARATUS

This application claims the benefit of Taiwan application Serial No. 99108935, filed Mar. 25, 2010, the subject matter of which is incorporated herein by reference.

FIELD OF THE INVENTION

The present invention relates to SRAM (Static Random Access Memory) writing system and related apparatus, and more particularly, to SRAM writing system and related apparatus controlling timing of introducing negative pulse voltage according to level transition of a dummy replica write bit-line for improving writing accuracy and speed of SRAM, speeding up bit-line recovery, shortening SRAM operation cycle, and raising SRAM operation frequency.

BACKGROUND OF THE INVENTION

Semiconductor memory, such as SRAM, is an essential building block of modern electronic systems. Generally, a memory has a plurality of cells aligned in matrix; cells of a same row are coupled to a same word-line, and cells of a same column are coupled to a same bit-line (or a same pair/group of bit-lines). For accessing data stored in each cell, each bit-line/ each group of bit-lines is/are coupled to a corresponding writing circuit through a write bit-line/a group of write bit-lines, also coupled to a corresponding reading circuit through a read bit-line/a group of read bit-lines. Signal level of a word-line controls a pass-gate mechanism of a cell coupled to the word-line. When a word-line turns on the pass-gate mechanism of a cell coupled to it, a writing circuit corresponding to the cell can then write data to the cell by controlling bit-line(s) corresponding to the cell through corresponding write bit-line(s), or a reading circuit can read data stored in the cell as the cell controls corresponding bit-line(s) and read bit-line(s).

SUMMARY OF THE INVENTION

In a general cell of a memory, its pass-gate mechanism is implemented with a pass-gate transistor/a pair of pass-gate transistors. As advanced semiconductor process evolves and demand on low operation voltage emerges, it becomes much more difficult for pass-gate transistors to fulfill conflicting requirements of data read and write.

For example, a basic 6-transistor (6T) cell of a SRAM is constructed by a pair of inverters and a pair of pass-gate transistors, each inverter has an input node coupled to an output node of the other inverter to form a latch with positive feedback, and the two output nodes of the two inverters are two differential data nodes respectively reflect a bit data and its complement stored in the cell. Each data node is coupled to one of a corresponding pair of bit-lines through one of the two pass-gate transistors.

To read data of a cell, the corresponding pair of bit-lines are pre-charged to a high level of logic 1; when the two pass-gate transistors are turned on, the inverter with input node coupled to data node of logic 1 will attempt to discharge the corresponding bit-line to a low level of logic 0 through the pass-gate transistor coupled to data node of logic 0. As the discharge begins, however, the pass-gate transistor and a transistor of the inverter form an equivalent voltage dividing structure between high level of the bit-line and low level of the cell array ground. In such circumstance, if the pass-gate transistor has a low turn-on resistance, level of the logic 0 data node will be drawn toward high level of logic 1. If the level of the data node is too high (exceeding a threshold level for the cell inverter to distinguish logic 0 and logic 1), data stored in the cell will be erroneously flipped. To avoid such read interference (normally referred to as "read disturb"), pass-gate transistors should be transistors of low conduction and high turn-on resistance.

On the other hand, for writing data to a cell, the corresponding pair of bit-lines are respectively charged and discharged to high level and low level respectively; when the pass-gate transistors are turned on, the pair of bit-lines will respectively charge/discharge the two data nodes through respective pass-gate transistors. Therefore, turn-on resistance of pass-gate transistors is preferably to be lower such that level of the data nodes can be rapidly charged/discharged to level of the bit-lines.

From the above description, it is known that the pass-gate transistors need to fulfill conflicting requirements of read and write; in memory of advance semiconductor process and low operation voltage, the conflict becomes much more serious. To resolve such conflict, one solution is to adopt weaker pass-gate transistors of lower conduction for read requirement, and to introduce a transient negative pulse voltage to the bit-line writing logic 0 when it is discharged to low level during data write, so as to enhance conduction of the pass-gate transistor, lower its turn-on resistance and fulfill write requirement.

However, the solution needs to precisely control timing of introducing the transient negative pulse voltage. For a preferable implementation of the solution, the transient negative pulse voltage should be coupled to the bit-line writing logic 0 after its level is completely discharged to low level, so level of the bit-line can be further lowered below low level of logic 0. If the negative pulse voltage is coupled to the bit-line before the bit-line is completely discharged, the negative pulse voltage can not effectively flip data of the cell for writing. Since time for discharging bit-lines varies due to drifting and variations of process, operation voltage and/or temperature, it is difficult to correctly determine the timing of introducing the negative pulse voltage.

Therefore, the invention provides a transient negative bit-line pulse voltage solution based on dummy replica bit-line for controlling timing of introducing the negative pulse voltage according to level transition of the dummy replica bit-line, such that the timing of introducing the negative pulse voltage can be adaptively adjusted following variations of process, operation voltage and/or temperature. Besides, the invention further improves speed of bit-line recovery with the dummy replica bit-line and negative pulse suppliers which supply the negative pulse voltages, so the write cycle of the memory (SRAM) can be shortened for faster writing and higher operation frequency/rate.

The invention can be implemented in a writing system of a memory, e.g., SRAM. In an embodiment, the writing system of the invention includes a dummy replica writing circuit, a negative pulse controller, a normal transmission circuit, a replica transmission circuit and at least a normal writing circuit. Each normal writing circuit corresponds to a pair of normal write bit-lines coupled to cells of a same column through a corresponding pair of normal bit-lines. Each normal writing circuit includes a selection circuit, a pre-charge circuit, a write driver and a negative pulse supplier. A word-line timing control mechanism provides a word-line timing signal and a write control signal according to a clock. The word-line timing signal controls the beginning and ending of write operation, and the write control signal controls timing of related circuits. The normal transmission circuit coupled to each normal writing circuit transmits the write control signal to each normal writing circuit, the replica transmission circuit, also coupled to each normal writing circuit, transmits a negative pulse control signal to the negative pulse supplier in each normal writing circuit for controlling coupling timing of the negative pulse voltage.

In each normal writing circuit, the selection circuit is coupled to the pre-charge circuit and the write driver; the write driver has a bias node coupling the negative pulse voltage to the corresponding normal write bit-lines. During write, the selection circuit receives a write data, such that the write driver can select one of the corresponding pair of normal write bit-lines according to the write data, and determine, according to level of the write control signal transmitted by the normal transmission circuit, whether to connect the selected normal write bit-line to level of the bias node for driving a level transition of the selected normal write bit-line. The pre-charge circuit has a pair of control nodes, and connects the corresponding normal write bit-lines to a second operation voltage, e.g., a power voltage, for driving level transition of the normal write bit-lines according to level of the control nodes. According to the write control signal, the pre-charge circuit and the write driver drive the normal write bit-lines in a complementary sense; for example, the pre-charge circuit includes a pair of p-channel MOS transistors with sources coupled to the power voltage, drains respectively coupled to the corresponding pair of normal write bit-lines and gates being the control nodes. Correspondingly, the write driver includes a pair of n-channel MOS transistors with drains respectively coupled to the normal write bit-lines, gates as a pair of control nodes and sources coupled together as the bias node. The selection circuit is coupled to the control nodes of the pre-charge circuit and the write driver, and controls the write driver to select a normal write bit-line to be driven. The negative pulse supplier is coupled to the bias node of the write driver; according to the negative pulse control signal transmitted by the replica transmission circuit, the negative pulse supplier alternately connects the bias node to one of an operation voltage, e.g., a ground voltage, and a negative pulse voltage which is different from the operation voltage. A signal path loading for the normal transmission circuit transmitting the write control signal matches that for the replica transmission circuit transmitting the negative pulse control signal, such that a propagation delay for the negative pulse control signal transmitted to each normal writing circuit tracks that for the write control signal transmitted to each normal writing circuit.

Similar to the normal writing circuit, the dummy replica writing circuit corresponds to at least a dummy replica write bit-line, and includes a dummy replica pre-charge circuit and a dummy replica write driver driving level transition of the dummy replica write bit-line(s). The dummy replica write bit-line(s) is/are coupled to dummy replica cells of a same column through corresponding dummy replica bit-line(s). The dummy replica cells, dummy replica bit-line(s) and dummy replica write bit-line(s) are respective replica of the normal cells, the normal bit-lines and the normal write bit-lines corresponding to the normal writing circuits; the dummy replica pre-charge circuit and the dummy replica write driver also respectively match the normal pre-charge circuit and the normal write driver, so level transition response (speed) of the dummy replica write bit-line(s) matches that of the normal write bit-lines. However, the dummy replica cells are not used to store practical data. The dummy replica pre-charge circuit is controlled by the word-line timing signal; according to the word-line timing signal, the dummy replica pre-charge circuit selects whether to connect the dummy replica write bit-line to the power voltage for driving level transition. Like the normal writing circuit, the dummy replica write driver has a control node, and is controlled by the write control signal. According to level transition of the dummy replica write bit-line(s), the negative pulse controller provides the negative pulse control signal.

When the SRAM of the invention performs data write, the write control signal triggers the dummy replica writing circuit to start discharging the dummy replica write bit-line from high level to low level; equivalently, level transition response of normal write bit-lines is therefore emulated. When the dummy replica write bit-line completes its level transition, the negative pulse controller can correspondingly reflect timing of introducing the negative pulse voltage with a corresponding level transition of the negative pulse control signal. The write control signal and the negative pulse control signal are transmitted to each normal writing circuit respectively by the normal transmission circuit and the replica transmission circuit. That is, time difference between the beginning of level transition of the dummy replica write bit-line and introducing the negative pulse voltage will be sequentially duplicated to each normal writing circuit by the write control signal through the normal transmission circuit and the negative pulse control signal through the replica transmission circuit, so each normal writing circuit can introduce the negative pulse voltage after its corresponding normal write bit-line completes level transition, and a preferable and optimized timing control for introducing the negative pulse can then be achieved.

In other words, the invention controls timing for each normal writing circuit to introduce the negative pulse voltage according to level transition of the dummy replica write bit-line; as the discharging response of the normal write bit-lines varies due to process/voltage/temperature variations and therefore causes a deviated level transition timing, timing of introducing the negative pulse voltage can adaptively track level transition of the normal write bit-lines for desired functioning of the negative pulse voltage.

In each normal writing circuit of the invention, the negative pulse supplier includes a capacitor, a first switch circuit and a second switch circuit. The capacitor has a first node and a second node, the first switch circuit is coupled to the first node of the capacitor and controls level of the first node according to level of the negative pulse control signal. The second switch circuit is coupled to the bias node of the write driver and the second node of the capacitor; according to the negative pulse control signal, the second switch circuit selects whether to connect the bias node of the write driver to the ground voltage. When the second switch circuit connects the bias node to the ground voltage of low level, the first switch circuit keeps the first node of the capacitor to high level, so charges can be charged between the first and second nodes of the capacitor to build a positive voltage difference between the first node and the second node. Under the control of the negative pulse control signal, when the second switch circuit stops connecting the bias node to the ground voltage, the first switch circuit switches the first node of the capacitor to the ground voltage of low level; with the positive voltage difference between the first and second nodes built by accumulated charges, a negative pulse voltage (lower than the ground voltage) can therefore be provided to the bias node of the write driver from the second node of the capacitor.

In another embodiment of the invention, the negative pulse supplier of each normal writing circuit further includes a delay circuit coupled to the second switch circuit for delaying level transition of the negative pulse control signal, so the second switch circuit selects whether to connect the bias node to the ground voltage according to the delayed negative pulse control signal. After data write, when the bit-lines start to recover, the delay circuit works to delay operation timing of the second switch circuit; as the first switch circuit switches the first node of the capacitor back to high level, the second switch circuit switches the second node back to low level after a delay interval. During this delay interval, high level of the first node and the voltage difference accumulated by charges of the capacitor will provide a positive pulse voltage coupled to the normal write bit-lines through the write driver, and the bit-line recovery of the normal write bit-lines can be speeded up.

In still another embodiment of the invention, the selection circuit of each normal writing circuit is further coupled to the bias node of the write driver, so the selection circuit selects whether to connect the bias node to the control nodes of the pre-charge circuit according to level of the write control signal. When the write control signal triggers the write driver to stop driving and the pre-charge circuit to start driving the normal write bit-lines, the selection circuit further connects the control nodes to the bias node, so the negative pulse voltage provided by the negative pulse supplier can also be connected to the control nodes of the precharge circuit. In this way, conduction of the pre-charge circuit can be enhanced to improve its driving ability, and therefore speed up bit-line recovery of the normal write bit-lines.

In another embodiment of the invention, the writing system further includes a dummy replica negative pulse supplier and a write ending controller. The dummy replica negative pulse supplier can be a replica of the negative pulse supplier in each normal writing circuit. Similar to operation of the negative pulse supplier in each normal writing circuit, the dummy replica negative pulse supplier is coupled to a bias node of the dummy replica write driver; according to level of the dummy replica write bit-line, the dummy replica negative pulse supplier alternately switches to connect the bias node of the dummy replica write driver to one of an operation voltage, e.g., the ground voltage, and a dummy replica negative pulse voltage different from the operation voltage. For the dummy replica write bit-line, the dummy replica negative pulse supplier duplicates operation of the negative pulse supplier for the normal write bit-lines, such that level transition of the dummy replica write bit-line can better emulate that of the normal write bit-lines.

One dummy replica cell of the dummy replica bit-line is used as a indication cell; this dummy replica cell stores a dummy data according to level of the dummy replica write bit-line, so the write ending controller can correspondingly generate a write ending signal according to data in the dummy replica cell; according to level transition of the write ending signal, the word-line timing signal and the write control signal can transit level to end the write cycle. That is, when each normal writing circuit starts to write data to the normal cell under the control of the write control signal, the dummy replica writing circuit also writes the dummy data to the indication cell through the dummy replica write bit-line under the control of the write control signal. As initial data of the indication cell is changed to the dummy data by writing, writing completion of the dummy replica write bit-line is indicated, and writing of the normal write bit-lines can be ended correspondingly: the write ending controller will reflect ending in the write ending signal, so the write cycle of the memory can be ended as soon as possible. In this way, period for writing can be effectively shortened to reduce memory operation cycle and increase memory operation frequency (rate).

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
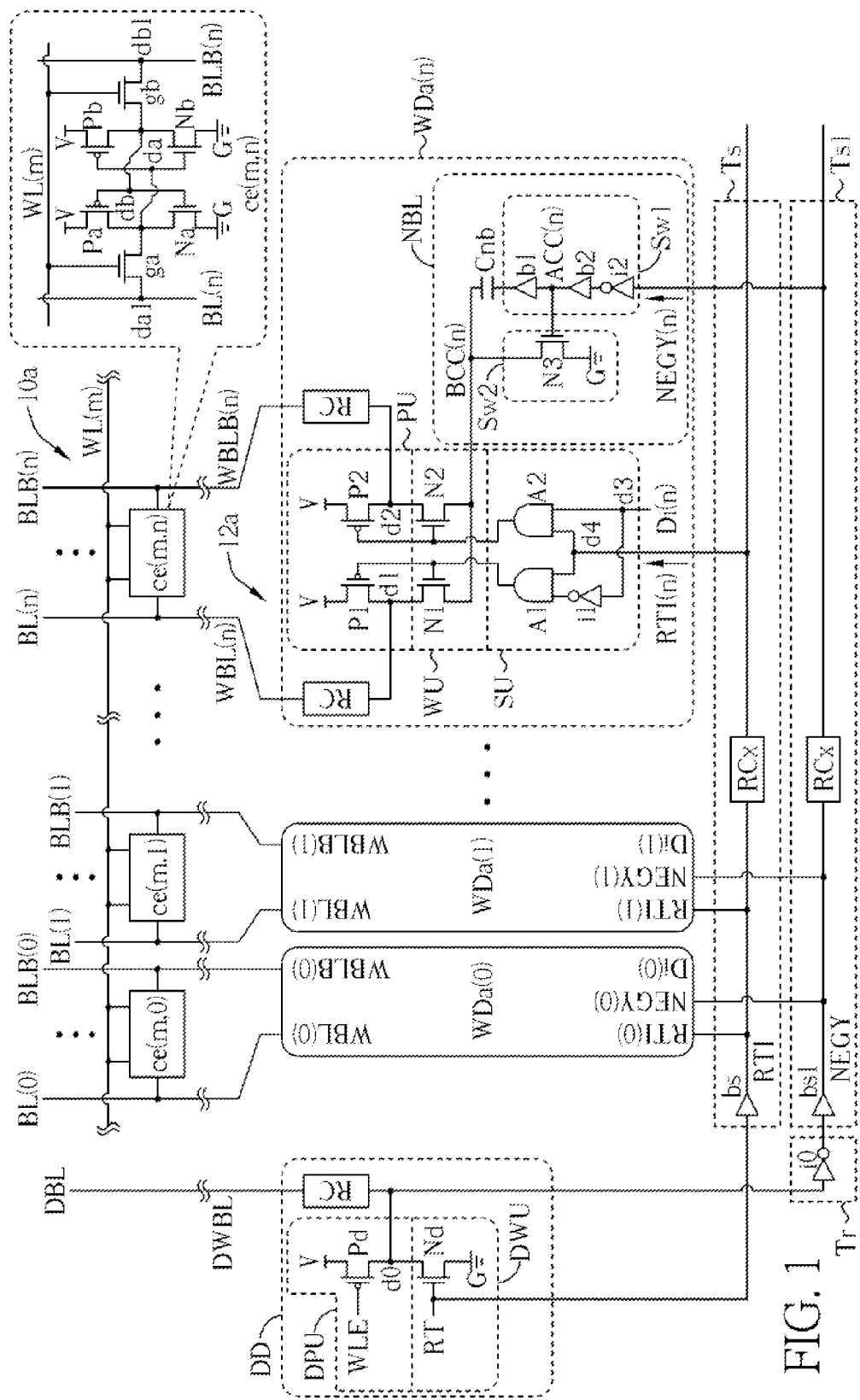
FIG. 1 illustrates a circuit according to an embodiment of the invention.

Please refer to FIG. 1 illustrating a circuit of a memory 10a according to an embodiment of the invention. In this embodiment, the memory 10a can be an SRAM with a plurality of cells aligned in matrix; cells of the m-th row which are commonly coupled to the word-line WL(m) include cells ce(m,0) of the zeroth column, ce(m,1) of the first column and ce(m,n) of the n-th column. As shown in the embodiment of FIG. 1, p-channel MOS transistors Pa, Pb and n-channel transistors Na, Nb form a pair of inverters operating between operation voltages V (a power voltage) and G (a ground voltage) in the cell ce(m,n); the inverter formed by the transistors Pa and Na has an input node and an output node at nodes db and da, respectively; and the inverter formed by the transistors Pb and Nb has its input and output nodes cross-coupled to the nodes da and db. N-channel MOS transistors ga and gb are pass-gate transistors with drain/source coupled to the nodes da/da1 and db/db1, and gates commonly coupled to the word-line WL(m). The nodes da1 and db1 are respectively coupled to a pair of bit-lines BL(n) and BLB(n). The nodes da and db are two data nodes respectively reflecting data stored in the cell ce(m,n) and its complementary. Cells coupled to bit-lines BL(0)/BLB(0), BL(1)/BLB(1) to BL(n)/BLB(n) are practically used to store data and form a memory space of the memory 10a, so these bit-lines are normal bit-lines of the memory 10a.

As previously discussed, while reading data of the cell ce(m,n), the corresponding bit-lines BL(n) and BLB(n) are pre-charged to high level of logic 1; after the word-line WL(m) signal turns on the pass-gate transistors ga and gb, if the cell ce(m,n) stores a bit data of logic 1 with the node da being a data node of logic 1, the inverter of transistors Pb and Nb will attempt to discharge the bit-line BLB(n) to low level of logic 0 through the pass-gate transistor gb coupled to the logic 0 data node db, so the reading mechanism (not shown) can determine data stored in the cell ce(m,n). However, when the discharge starts, turn-on resistance between the drain and source of the pass-gate transistor gb and that of the transistor Nb form a voltage dividing structure at the logic 0 data node db between high level of the bit-line BLB(n) and low level of the ground voltage G. Under such circumstance, if the turn-on resistance of the pass-gate transistor gb is too low, level of the logic 0 data node db will be raised toward high level; once the level of the node db exceeds the threshold level of the inverter Pa/Na to distinguish logic 0 and logic 1, it is recognized as logic 1 and then causes an erroneous data flip of the cell ce(m,n). To avoid the undesired data flip, the pass-gate transistors ga and gb are preferably transistors of lower conductance and higher turn-on resistance. On the contrary, during data write, conduction of the pass-gate transistors ga and gb are preferably to be higher to facilitate discharging of the data storage node. To resolve contradictary requirements of read and write, technique of negative pulse is adopted in the invention.

For effective and rapid data writing of cells of the pairs of normal bit-lines, as well as implementation of negative pulse technique of the invention, the memory 10a includes a writing system 12a; in the embodiment of FIG. 1, the writing system 12a of the invention has a dummy replica writing circuit DD, a negative pulse controller Tr, a normal transmission circuit Ts, a replica transmission circuit Ts1 and normal writing circuits WDa(0), WDa(1) to WDa(n). The pairs of bit-lines BL(0)/BLB(0), BL(1)/BLB(1) to BL(n)/BLB(n) are respectively coupled to corresponding normal writing circuit WDa(0), WDa(1) to WDa(n) through pairs of normal write bit-lines WBL(0)/WBLB(0), WBL(1)/WBLB(1) to WBL(n)/VVBLB(n), such that the normal writing circuits WDa(0), WDa(1) to WDa(n) can respectively write bit data Di(0), Di(1) to Di(n) to corresponding cells of normal bit-lines. The normal writing circuit WDa(0) to WDa(n) are based on matched circuit architecture and operation principle, and the writing circuit WDa(n) is taken as an example for further explanation.

In FIG. 1, word-line timing control mechanism (not shown) provides a word-line timing signal WLE and a synchronized write control signal RT according to a clock CK (not shown). The word-line timing signal WLE controls beginning and ending of write operation/procedure/cycle, the write control signal RT controls timing of related circuits. The normal transmission circuit Ts, coupled to each of the normal writing circuits WDa(0), WDa(1) to WDa(n), transmits the write control signal RT to each of the normal writing circuits WDa(0), WDa(1) and WDa(n); the replica transmission circuit Ts1, also coupled to each normal writing circuit, transmits a negative pulse control signal NEGY to each normal writing circuit for controlling coupling timing of the negative pulse voltage. As illustrated by FIG. 1, the normal transmission circuit Ts includes a buffer bs so the write control signal RT is transmitted as a write control signal RTI, and the replica transmission circuit Ts1 includes a buffer bs1 so a signal output by the negative pulse controller Tr is transmitted as the negative pulse control signal NEGY. To demonstrate operations of the normal transmission circuit Ts and the replica transmission circuit Ts1, the write control signal RTI and the negative pulse control signal NEGY transmitted to the n-th normal writing circuit WDa(n) are respectively marked as RTI(n) and NEGY(n); for example, by the normal transmission circuit Ts and the replica transmission circuit Ts1, the write control signal RTI and the negative pulse control signal NEGY are respectively transmitted as the write control signal RTI(0) and the negative pulse control signal NEGY(0) to the normal writing circuit WDa(0). That is, the n-th normal writing circuit WDa(n) receives the write data Di(n) of a single bit to be written, and drives corresponding normal write bit-lines WBL(n) and WBLB(n) according to the write control signal RTI(n) and the negative pulse control signal NEGY(n), so the write data Di(n) can be written to the cell ce(m,n).

As shown in FIG. 1, the normal writing circuit WDa(n) includes a selection circuit SU, a pre-charge circuit PU, a write driver WU and a negative pulse supplier NBL. The selection circuit SU is coupled to the pre-charge circuit PU and the write driver WU. In the embodiment of FIG. 1, the pre-charge circuit PU includes a pair of p-channel MOS transistors P1 and P2 with sources coupled to the power voltage V, drains respectively coupled to the normal write bit-lines WBL(n) and WBLB(n) at nodes d1 and d2, and gates as a pair of control nodes. Correspondingly, the write driver WU includes a pair of n-channel MOS transistors N1 and N2 with drains respectively coupled to the normal write bit-lines WBL(n) and WBLB(n) at the nodes d1 and d2, gates also as a pair of control nodes, and sources commonly coupled to a node BCC(n), which is a bias node of the write driver WU. The selection circuit SU includes two AND gates A1, A2 and an inverter i1; output nodes of the two AND gates A1 and A2 are respectively coupled to the gates of the transistors P1/N1 and P2/N2, i.e., control nodes of the pre-charge circuit PU and the write driver WU, an input node of each of the AND gates A1 and A2 receives the write control signal RTI(n) at a node d4. The selection circuit SU receives the write data Di(n) at a node d3; the write data Di(n) provides input to the other input node of the AND gate A2, and is inverted by the inverter i1 for input to the other input node of the AND gate A1. That is, the selection circuit SU is coupled to the control nodes of the pre-charge circuit PU and the write driver WU, such that the write driver WU selects which one of the normal write bit-lines WBL(n) and WBLB(n) to be driven according to the write data Di(n); also, according to the write control signal RTI(n), the pre-charge circuit PU and the write driver WU complementarily drive the normal write bit-lines WBL(n) and WBLB(n).

In the normal writing circuit WDa(n), the negative pulse supplier NBL is coupled to the bias node of the write driver WU, and alternately switches to conduct the bias node to one of the ground voltage G and a negative pulse voltage according to the negative pulse control signal NEGY(n) transmitted by the replica transmission circuit Ts1; the negative pulse voltage and the ground voltage G are different. The negative pulse supplier NBL includes a capacitor Cnb and two switch circuits Sw1 and Sw2. The capacitor Cnb has a first node and a second node. In the embodiment of FIG. 1, the switch circuit Sw1 (a first switch circuit) includes an inverter i2 and buffers b1 and b2; the negative pulse control signal NEGY(n) is inverted by the inverter i2 and coupled to a node ACC(n) through the buffer b2, and the switch circuit Sw1 is coupled to the first node of the capacitor Cnb through the node ACC(n) (and the buffer b1) for controlling level of the first node according to the negative pulse control signal NEGY(n). The switch circuit Sw2 (the second switch circuit) can be implemented by an n-channel MOS transistor N3 with a drain coupled to the bias node of the write driver WU and the second node of the capacitor Cnb at a node BCC(n) and a gate coupled to the node ACC(n), so it can select whether to connect the bias node of the write driver WU to the ground voltage G at source of the transistor N3. Under control of the negative pulse control signal NEGY(n), when the switch circuit Sw2 connects the bias node at the node BCC(n) to low level of the ground voltage G, the switch circuit Sw1 keeps the node ACC(n) at high level of logic 1 through the buffer b1, thus charges are charged between the first and second nodes of the capacitor Cnb to build a positive voltage difference between the first node (the node ACC(n)) and the second node (the node BCC(n)). When the negative pulse control signal NEGY(n) transits level, the switch circuit Sw2 stops connecting the bias node (the node BCC(n)) to the ground voltage G, and the switch circuit Sw1 switches the node ACC(n) to low level of the ground G; with the positive voltage difference built by charge accumulation between the first and second nodes, a negative pulse voltage lower than the ground voltage G can therefore be provided to the write driver WU through the node BCC(n), i.e., the second node of the capacitor Cnb.

Similar to the normal writing circuits WDa(0) to WDa(n), the dummy writing circuit DD of the invention also corresponds to at least a dummy replica write bit-line DWBL, and includes a dummy replica pre-charge circuit DPU and a dummy replica write driver DWU for driving level transition of the dummy replica write bit-line DWBL. The dummy replica write bit-line DWBL is coupled to dummy replica cells (not shown) of a same column through a corresponding dummy replica bit-line DBL; however, these dummy replica cells are not used to practically store data and excluded from memory space of the memory 10a. Circuit architectures and layout arrangements of the dummy replica cell, the dummy replica bit-line and the dummy replica write bit-line are duplicated replica of those of the normal cell, the normal bit-lines and the normal write bit-lines, such that the equivalent capacitance-resistance (RC) loading of the dummy replica write bit-line DWBL is essentially the same as that of the normal write bit-line WBL(n) or WBLB(n); also the dummy replica pre-charge circuit DPU and the dummy replica write driver DWU respectively match the pre-charge circuit PU and the write driver WU of each normal writing circuit WDa(n), such that level transition response and speed of the dummy replica write bit-line closely match and equal those of the normal write bit-line WBL(n) or WBLB(n).

Though only one dummy replica write bit-line DWBL is illustrated in FIG. 1, the memory 10a of the invention can include a pair of dummy replica write bit-lines coupled to dummy replica cells (e.g., similar to cell ce(m,n)) of a same column through a pair of dummy replica bit-lines; while writing data, only one, selected according to the write data Di(n), of the normal write bit-lines WBL(n) and WBLB(n) of each normal writing circuit WDa(n) will be discharged by the write driver WU, so a single dummy replica write bit-line DWBL is enough to duplicate level transition response of a normal write bit-line, and a single p-channel MOS transistor Pd and a single n-channel MOS transistor Nd are shown in FIG. 1 to represent driving mechanism of the dummy replica write bit-line DWBL. The transistor Pd matches the transistors P1 and P2 of the pre-charge circuit PU, the transistor Nd matches the transistors N1 and N2 of the write driver WU; gate of the transistor Pd receives the word-line timing signal WLE, such that the dummy replica pre-charge circuit DPU can select whether to connect the dummy replica write bit-line DWBL to the power voltage V for a level transition according to the word-line timing signal WLE. The transistor Nd has a source, a bias node of the dummy replica write driver DWU, coupled to the ground voltage G, and a gate controlled by the write control signal RT. The negative pulse controller Tr is coupled to the dummy replica write bit-line DWBL, so it can generate the negative pulse control signal NEGY according to level of the dummy replica write bit-line DWBL. The negative pulse controller Tr includes an inverter i0 inverting level of the dummy replica write bit-line DWBL to become the negative pulse control signal NEGY of a digital form.

With proper setting and layout arrangements of the buffers bs and bs1, signal path loading for the normal transmission circuit Ts transmitting the write control signal RTI matches that for the replica transmission circuit Ts1 transmitting the negative pulse control signal NEGY, such that a propagation delay for the negative pulse control signal NEGY transmitted to each of the normal writing circuits WDa(0) to WDa(n) tracks that for the write control signal RTI transmitted to each of the normal writing circuits WDa(0) to WDa(n).

Figure 2:
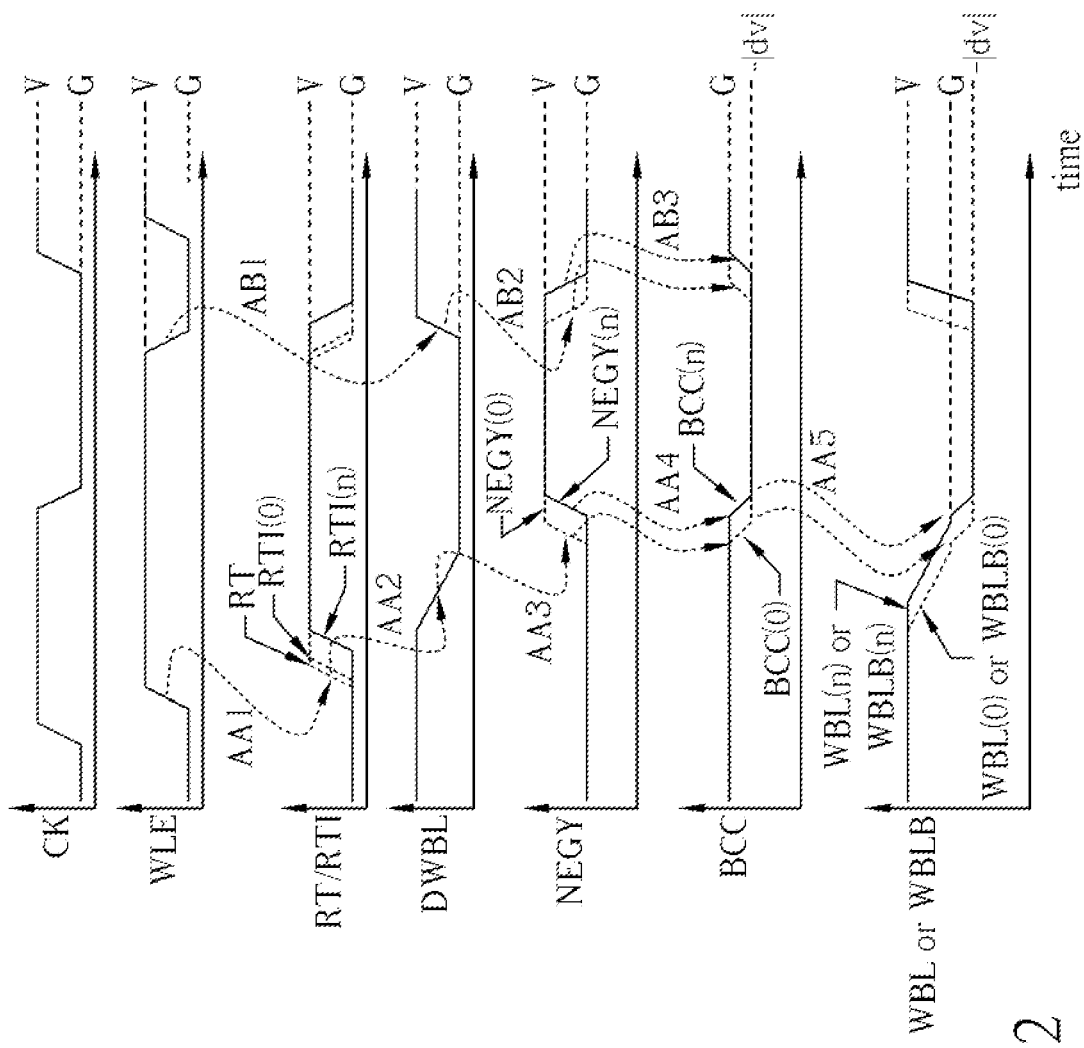
FIG. 2 is a timing diagram illustrating waveforms of signals of the circuit of FIG. 1.

Following the embodiment of FIG. 1, please refer to FIG. 2 as operation of the invention is explained by timing diagrams shown in FIG. 2 which illustrate waveforms of signals of FIG. 1; transverse axes of the waveforms represent time, and longitudinal axes of the waveforms represent signal level, e.g., voltage level. As previously described, timing control mechanism of the memory 10a generates the word-line timing signal WLE and the write control signal RT according to the clock CK. When the memory 10a starts writing, the word-line timing signal WLE transits from low level of the ground voltage G to high level of the power voltage V, and correspondingly the write control signal RT also transits from low level to high level, as indicated by the arrow AA1. High level of the write control signal RT turns on the transistor Nd of the dummy replica write driver DWU, and the dummy replica write bit-line DWBL starts to be discharged from high level of pre-charge to low level for emulating level transition of normal write bit-lines, as indicated by the arrow AA2. When the dummy replica write bit-line DWBL transits level, the negative pulse controller Tr correspondingly transits the negative pulse control signal NEGY from low level to high level, as shown by the arrow AA3; from previous discussion, it is understood that the negative pulse voltage is preferably introduced after corresponding normal write bit-line transits to low level, so the timing difference between rising edges of the write control signal RT and the negative pulse control signal NEGY can reflect the preferable timing for introducing the negative pulse voltage.

The write control signal RTI and the negative pulse control signal NEGY are transmitted to the write driver WU and the negative pulse supplier NBL in each of the normal writing circuits WDa(0) to WDa(n) by the normal transmission circuit Ts and the replica transmission circuit Ts1, respectively. In the embodiment of FIG. 1, the normal writing circuit DWa(0) is closer to the dummy replica writing circuit DD while the normal writing circuit DWa(n) is relatively farther away, so there is a propagation delay between the write control signals RTI(0) and RTI(n) respectively received by the normal writing circuits DWa(0) and DWa(n) from the normal transmission circuit Ts, e.g., a time difference between rising edges of the write control signals RTI(0) and RTI(n), as shown in FIG. 2. Similarly, there is a time difference between the negative pulse control signals NEGY(0) and NEGY(n) respectively received by the normal writing circuits WDa(0) and WDa(n). However, because the normal transmission circuit Ts and the replica transmission circuit Ts1 mutually match, the time difference between the write control signal RT and the negative pulse control signal NEGY, the time difference between the write control signal RT(0) and the negative pulse control signal NEGY(0), as well as the time difference between the write control signal RT(n) and the negative pulse control signal NEGY(n) track each other closely. That is, by operations of the normal transmission circuit Ts and the replica transmission circuit Ts1, the time difference between beginning of the level transition of the dummy replica write bit-line DWBL (controlled by the write control signal RT) and the level transition of negative pulse control signal NEGY will be sequentially duplicated to each of the normal writing circuits WDa(0) to WDa(n), such that the normal writing circuit WDa(0) introduces the negative pulse voltage after one of its corresponding normal write bit-lines (WBL(0) and WBLB(0)) completes level transition, and the normal writing circuit WDa(n) introduces the negative pulse voltage after one of its corresponding normal write bit-lines (WBL(n) and WBLB(n)) completes level transition; in this way, timing of introducing the negative pulse voltage can be optimized.

In the normal writing circuit WDa(n), when the negative pulse control signal NEGY(n) transits from low level to high level, level of the node ACC(n) transits from high level to low level; before the transition, original high level of the node ACC(n) turns on the transistor N3 of the switch circuit SW2 to keep the node BCC(n) at low level of the ground voltage G. After the transition, however, the switch circuit Sw1 switches the node ACC(n) to low level, and the transistor N3 of the switch circuit Sw2 is turned off; because the capacitor Cnb tends to maintain original voltage difference dv between its two nodes, level of the node BCC(n) becomes lower than the ground voltage G to provide a negative pulse voltage −|dv|, as indicated by the arrow AA4; and this negative pulse voltage is coupled to one of the normal write bit-lines WBL(n) and WBLB(n) through the bias node of the write driver WU (sources of the transistors N1 and N2). For example, if logic 1 is written to the cell ce(m,n), the write driver WU selects to drive the normal write bit-line WBLB(n) to discharge it from high level of pre-charge to low level under the control of the write control signal RTI(n); when the normal write bit-line WBLB(n) is discharged to low level, the negative pulse control signal NEGY(n) will timely trigger the negative pulse voltage mechanism, such that the negative pulse voltage can be coupled to the normal write bit-line WBLB(n), as denoted by the arrow AA5. As the negative pulse voltage is further coupled to the bit-line BLB(n), it enhances conduction of the pass-gate transistor gb to reduce its source-drain turn-on resistance. In this way, even circuit architectures and layout designs of the transistors ga and gb prefer read requirement, the negative pulse voltage will fulfill write requirement during data write.

In FIG. 2, the node BCC(0) corresponds to the normal writing circuit WDa(0) just as the node BCC(n) corresponds to the normal writing circuit WDa(n). Because the negative pulse control signal NEGY(n) lags behind the negative pulse control signal NEGY(0), level transition of the node BCC(n) lags behind that of the node BCC(0). However, the propagation delays track each other to ensure a preferable/proper timing of introducing the negative pulse voltage. As illustrated by FIG. 2, the invention controls timing of the negative pulse voltage based on level transition of the dummy replica write bit-line DWBL; even though charging/discharging responses of the normal write bit-lines vary due to variations of process/operation voltages/temperature, timing of introducing the negative pulse voltage can be adaptively adjusted to track level transition of the normal write bit-lines, so the negative pulse voltage works with desired timing/function.

Furthermore, only a single set of the dummy replica writing circuit DD is sufficient to control plural of normal writing circuits, so the layout overhead for implementing negative pulse voltage can be effectively reduced.

After writing, the word-line timing signal WLE transits from high level to low level; correspondingly, the dummy replica pre-charge circuit DPU of the dummy replica writing circuit DD will be turned on to pre-charge the dummy replica write bit-line DWBL to high level again, as denoted by the arrow AB1. Level transition of the dummy replica write bit-line DWBL triggers level transitions of the negative pulse control signals NEGY(0) to NEGY(n), as shown by the arrow AB2. When the normal writing circuit WDa(n) receives level transition of the negative pulse control signal NEGY(n), the switch circuit Sw1 switches the node ACC(n) to high level again, and the switch circuit Sw2 restores the ground voltage G at the node BCC(n), as indicated by the arrow AB3. Meanwhile, the switch circuit Sw1 charges the first node of the capacitor Cnb to high level through the node ACC(n) and the buffer b1. Following level transition of the word-line timing signal WLE, the write control signals RT, RT(0) to RT(n) will sequentially transit from high level to low level; controlled by low level of the write control signal RTI(n), the pre-charge circuit PU in the normal writing circuit WDa(n) conducts to pre-charge the discharged normal write bit-line WBL(n) or WBLB(n) back to high level. Pre-charging the normal write bit-lines is know as bit-line recovery, which allows the normal write bit-lines WBL(n) and WBLB(n) to be charged back to high level for next write or read operation.

Figure 3:
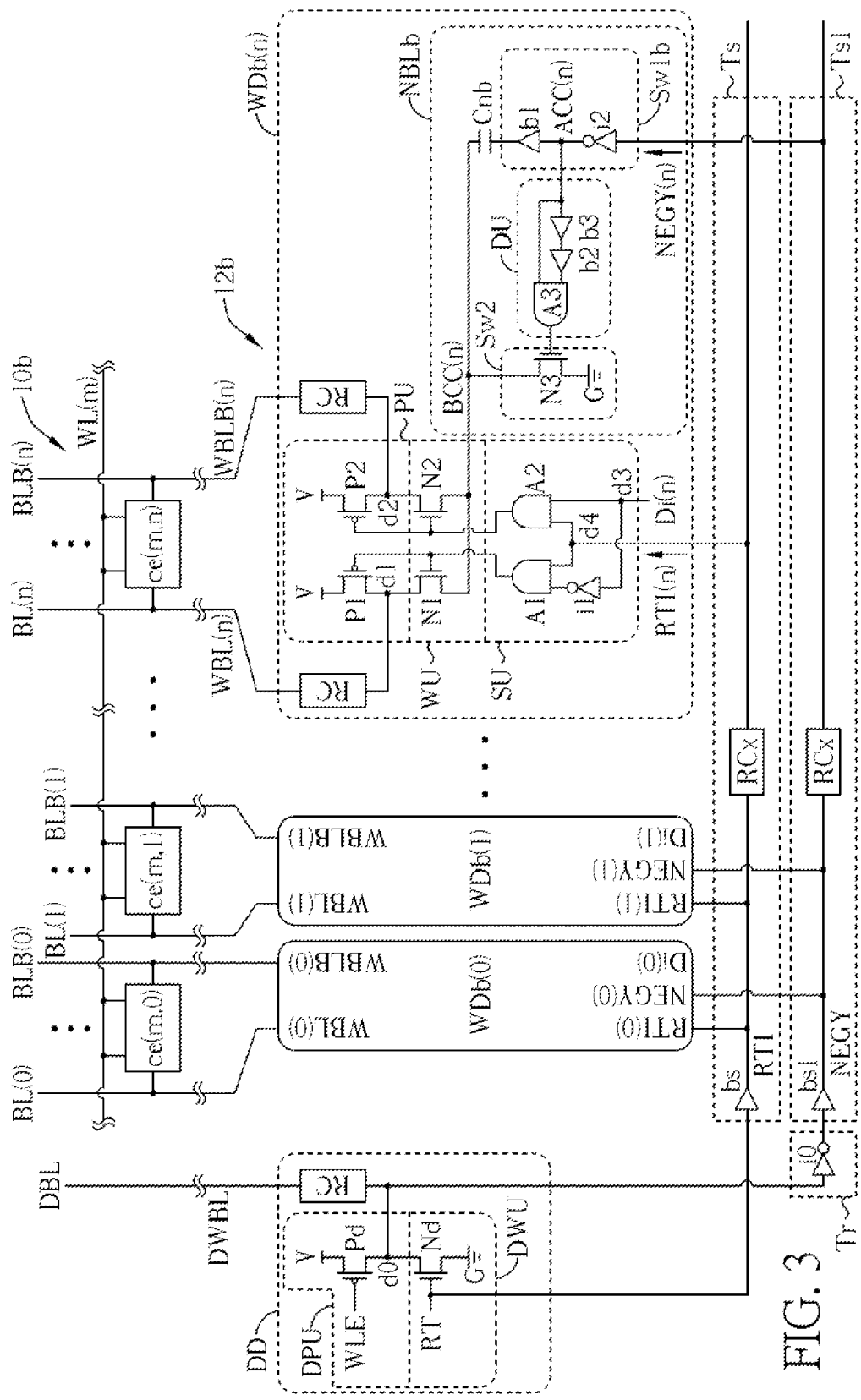
FIG. 3 illustrates a circuit according to another embodiment of the invention.

Please refer to FIG. 3 which illustrates circuit of a memory 10b according to a second embodiment of the invention. Similar to the embodiment of FIG. 1, the memory 10b of FIG. 3 also includes cell matrix with cells of a column coupled to a corresponding normal writing circuit of a writing system 12b through corresponding normal bit-lines and normal write bit-lines for implementing writing mechanism of the memory 10b; in addition, the memory 10b also includes the dummy replica bit-line DBL, the dummy replica write bit-line DWBL and the corresponding dummy replica writing circuit DD. With the word-line timing signal WLE, the write control signal RT, the negative pulse control signal NEGY of the negative pulse controller Tr and cooperation of the normal transmission circuit Ts and the replica transmission circuit Ts1, write timing of the normal writing circuits can be controlled. For example, the cell ce(m,n) is coupled to the normal writing circuit WDb(n) through the bit-lines BL(n)/BLB(n) and the normal write bit-lines WBL(n)/WBLB(n), so the normal writing circuit WDb(n) can write the write data Di(n) to the cell ce(m,n) under timing control of the write control signal RTI(n) and the negative pulse control signal NEGY(n).

Similar to the normal writing circuit WDa(n) of FIG. 1, each of the normal writing circuits WDb(0) to WDb(n) of FIG. 3 also includes the pre-charge circuit PU, the write driver WU and the selection circuit SU; however, the negative pulse supplier NBLb of FIG. 3 is different. The negative supplier NBLb also includes the capacitor Cnb and the switch circuits Sw1b and Sw2; in addition, it includes a delay circuit DU coupled between the node ACC(n) and the switch circuit Sw2. As an analogy of the switch circuit Sw1 of FIG. 1, the switch circuit Sw1b of FIG. 3 also includes the inverter i2 and the buffer b1 for controlling voltage level of the node ACC(n) and the first node of the capacitor Cnb according to the inverted negative pulse control signal NEGY(n); the switch circuit Sw2 can be implemented by the transistor N3, too. The delay circuit DU has an AND gate A3 and two buffers b2 and b3; an input node of the AND gate A3 is directly connected to the node ACC(n), while the other input node is coupled to the node ACC(n) through the buffers b2 and b3, and an output node of the AND gate A3 is coupled to gate of the transistor N3 for conduction control of the transistor N3. When bit-line recovery starts, the delay circuit DU delays timing control of the negative pulse control signal NEGY(n) for the switch circuit Sw2, such that the switch circuit Sw2 selects whether to connect the bias node of the write driver WU (the node BCC(n)) to the ground voltage G according to the delayed negative pulse control signal NEGY(n).

Figure 4:
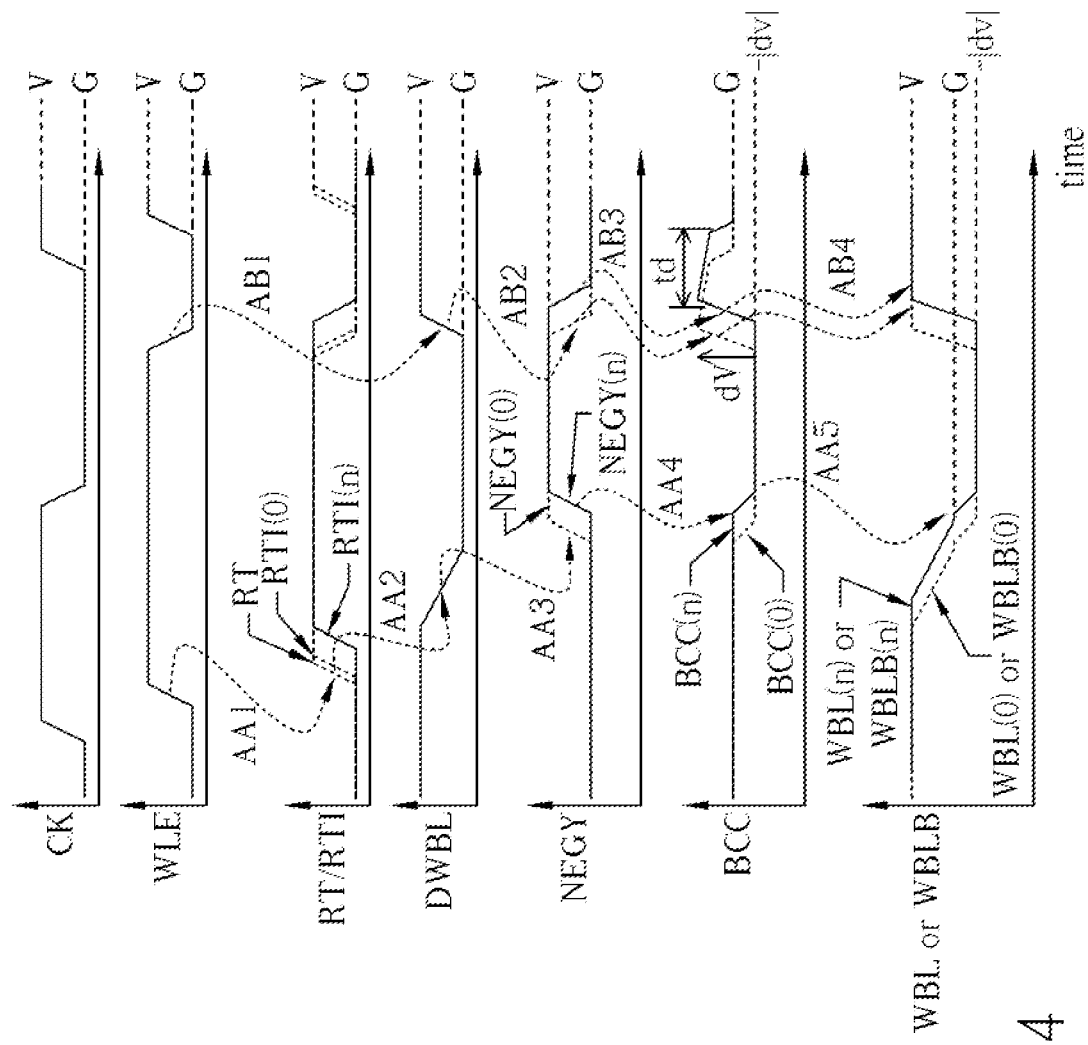
FIG. 4 is a timing diagram illustrating waveforms of signals of the circuit of FIG. 3.

Following the embodiment of FIG. 3, operation of the memory 10b is illustrated by timing diagrams of waveforms shown in FIG. 4. As discussed in FIG. 1 and FIG. 2, when writing ends, the word-line timing signal WLE transits from high level to low level, the dummy replica write bit-line DWBL is charged back to high level, and the negative pulse control signals NEGY(0) to NEGY(n) transit from high level to low level, as indicated by the arrow AB2. From the architecture of the delay circuit DU, it is understood that when the negative pulse control signal NEGY(n) transits from high level to low level to make level of the node ACC(n) transit from low level to high level, voltage level fed to the gate of transistor N3 will not immediately transit from low level to high level; due to a delay interval td introduced by the buffers b2 and b3, the output of the AND gate A3 (i.e. the gate of transistor N3) transits from low level to high level after output of the buffer b2 transits from low level to high level. That is, while the switch circuit Sw1b charges the node ACC(n) (the first node of the capacitor Cnb) back to high level, the switch circuit Sw2 waits for a delay interval td before connecting the node BCC(n) (the second node of the capacitor Cnb) back to the ground voltage G, as shown by the arrow AB3. During the delay interval td, high level of the node ACC(n) and the voltage difference accumulated by charges in the capacitor Cnb raise level of the node BCC(n) by a voltage difference dV from the voltage (−|dv|) below the ground voltage G, and the raised level of the node BCC(n) will be coupled to the normal write bit-line WBL(n) or WBLB(n) through the write driver WU, as shown by the arrow AB4. With such coupling arrangement, the normal write bit-line discharged to the negative pulse voltage during write can be charged back to high level more rapidly, and bit-line recovery of the normal write bit-lines therefore speeds up. The magnitude of the voltage difference dV depends on voltage difference between the power voltage V and the ground voltage G, as well as a capacitance ratio between the capacitor Cnb and capacitance of the bit-line BL(n) or BLB(n).

Figure 5:
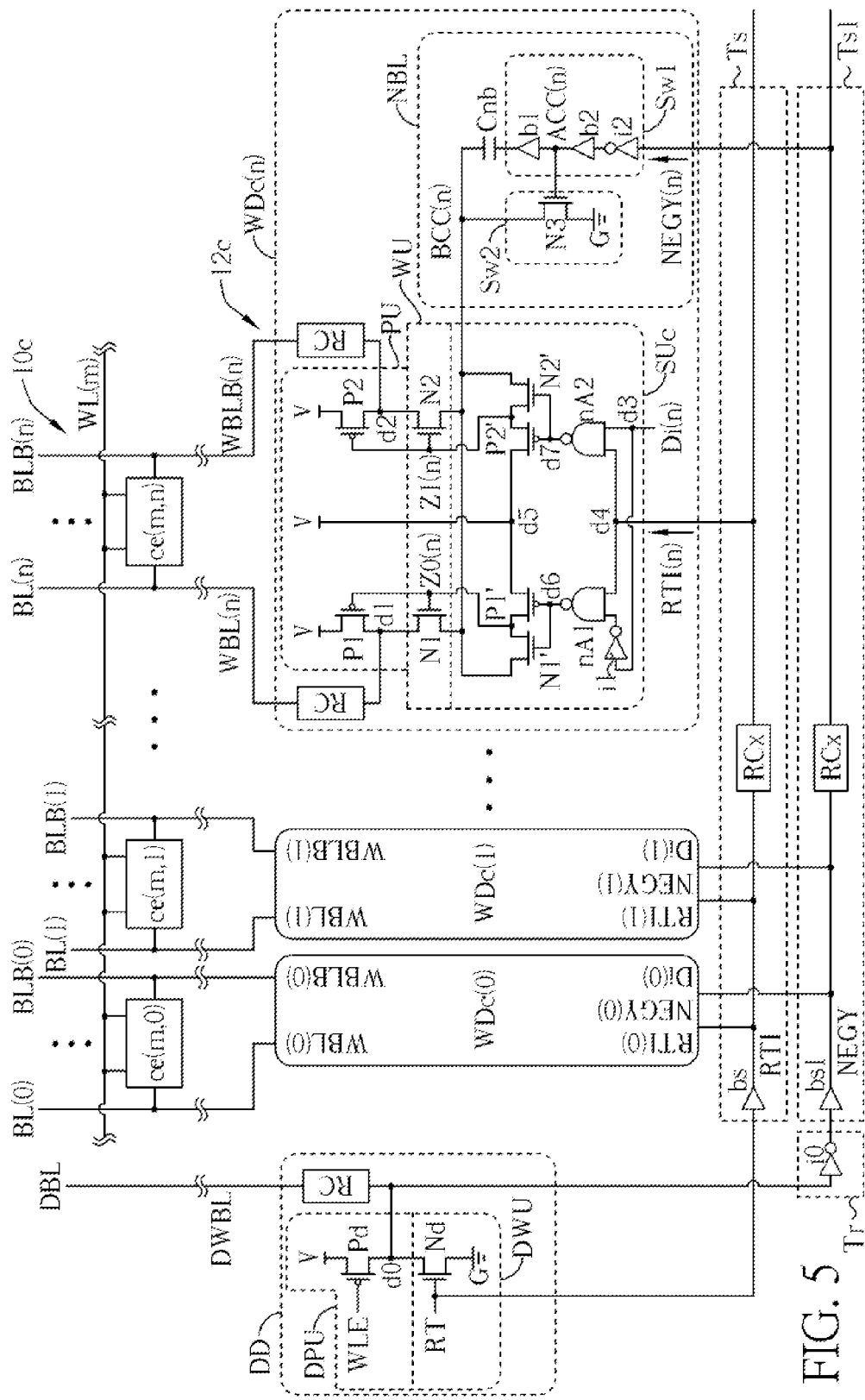
FIG. 5 illustrates a circuit according to still another embodiment of the invention.

Please refer to FIG. 5; following the embodiment of FIG. 1, FIG. 5 illustrates circuit of a memory 10c according to another embodiment of the invention. Similar to the embodiment of FIG. 1, the memory 10c of FIG. 5 also includes cell matrix with cells of a column coupled to a corresponding normal writing circuit of a writing system 12c through corresponding normal bit-lines and write bit-lines for implementing writing mechanism of the memory 10c. The memory 10c also includes the dummy replica bit-line DBL, the dummy replica write bit-line DWBL and the corresponding dummy replica writing circuit DD; with the word-line timing signal WLE, the write control signal RT, the negative pulse control signal NEGY of the negative pulse controller Tr and cooperation of the normal transmission circuit Ts and the replica transmission circuit Ts1, write timing of the normal writing circuits can be controlled. For example, the cell ce(m, n) is coupled to the normal writing circuit WDc(n) through the bit-lines BL(n)/BLB(n) and the normal write bit-lines WBL(n)/WBLB(n), so the normal writing circuit WDc(n) can write the write data Di(n) to the cell ce(m,n) under timing control of the write control signal RTI(n) and the negative pulse control signal NEGY(n).

In the embodiment of FIG. 5, the normal writing circuit WDc(n) also includes the pre-charge circuit PU, the write driver WU, the negative pulse supplier NBL and the selection circuit SUc. The former three circuits can adopt same circuit architectures of the pre-charge circuit PU, the write driver WU and the negative pulse supplier NBL of FIG. 1. However, the selection circuit SUc of FIG. 5 is different. In the selection circuit SUc, a p-channel MOS transistor P1' and an n-channel MOS transistor N1' forms an inverter with an output node coupled to a control node (gate of the transistor P1) of the pre-charge circuit PU at a node Z0(n), and an input node coupled to output of a NAND gate nA1 at a node d6 to form an AND gate with the NAND gate nA1; this AND gate functions like the AND gate A1 in the selection circuit SU of FIG. 1 to receive the inverted write data Di(n) at the node d3 and the write control signal RTI(n) at the node d4. While the AND gate A1 of FIG. 1 operates between the power voltage V and the ground voltage G, in FIG. 5, the source of the transistor N1' and the bias node of the write driver WU (sources of the transistors N1 and N2) are commonly coupled to the node BCC(n).

Similarly, a p-channel MOS transistor P2' and an n-channel MOS transistor N2' forms another inverter with an output node coupled to the other control node (gate of the transistor P2) of the pre-charge circuit PU at a node Z1(n), and an input node coupled to output of a NAND gate nA2 at a node d7 to form another AND gate with the NAND gate nA2; this AND gate functions like the AND gate A2 in the selection circuit SU of FIG. 1 to receive write data Di(n) at the node d3 and the write control signal RTI(n) at the node d4. However, source of the transistor N2' and the bias node of the write driver WU are commonly coupled to the node BCC(n).

Figure 6:
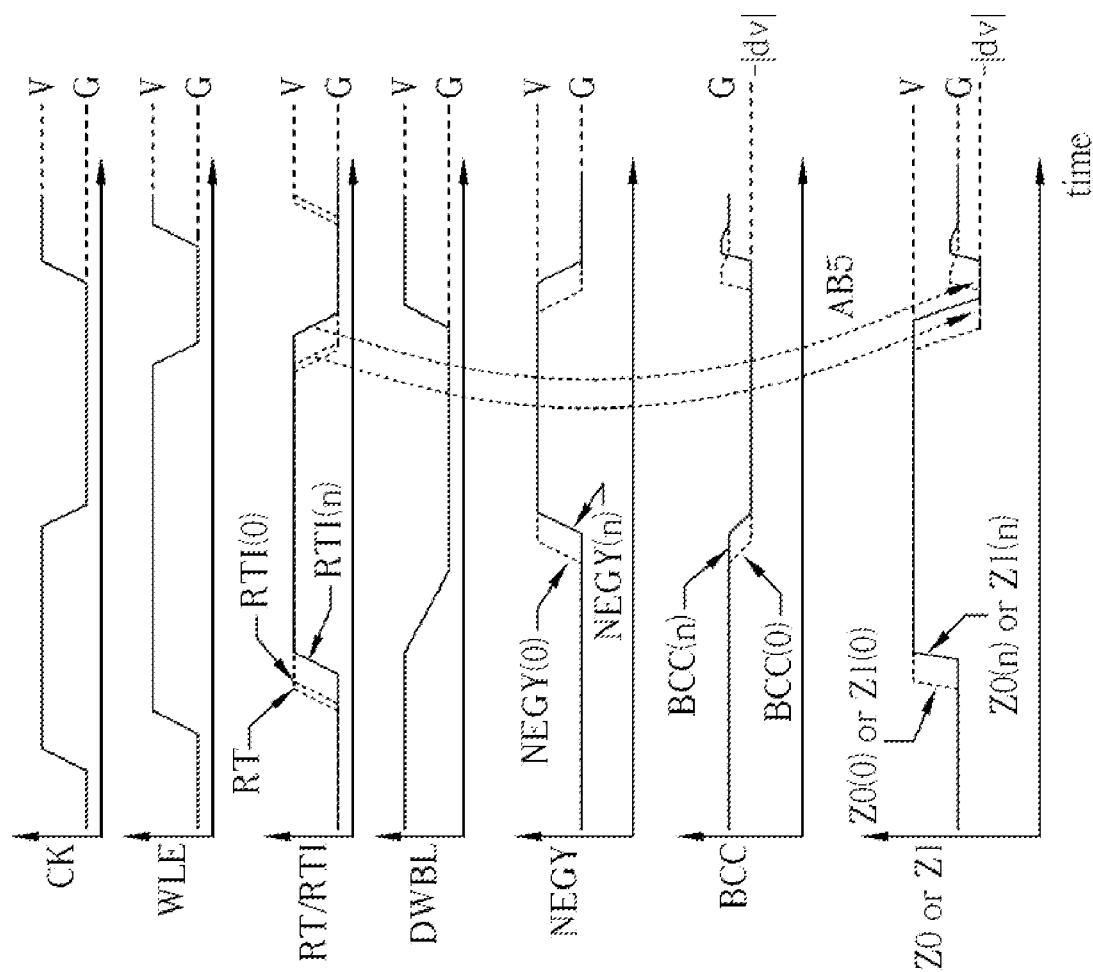
FIG. 6 is a timing diagram illustrating waveforms of signals of the circuit of FIG. 5.

That is, in the embodiment of FIG. 5, the selection circuit SUc of the normal writing circuit WDc(n) is further coupled to the bias node of the write driver WU, such that the selection circuit SUc selects whether to connect the bias node at the node BCC(n) to the control nodes (Z0(n) and Z1(n)) of the pre-charge circuit PU in accordance with the write control signal RTI(n). Please also refer to FIG. 6 illustrating waveforms of signals in the memory 10c. When bit-line recovery starts, as the write control signal RTI(n) transits from high level to low level to stop driving of the write driver WU and to start driving of the pre-charge circuit PU for the normal write bit-lines WBL(n) and WBLB(n), the selection circuit SUc further connects the control nodes of the pre-charge circuit PU to the bias node of the node BCC(n), so the negative pulse voltage provided to the node BCC(n) by the negative supplier NBL is connected to the control nodes of the nodes Z0(n) and Z1(n) to pull down their levels below the ground voltage G, as indicated by the arrow AB5. In this way, conduction of the p-channel MOS transistors P1 and P2 in the pre-charge circuit PU can be enhanced to increase their driving ability, and therefore bit-line recovery of the normal write bit-lines speeds up. For level waveforms, the label Z0(n)/Z1(n) represent nodes in the n-th normal writing circuit WDc(n), and the label Z0(0)/Z1(0) represent corresponding nodes in the normal writing circuit WDc(0).

Figure 7:
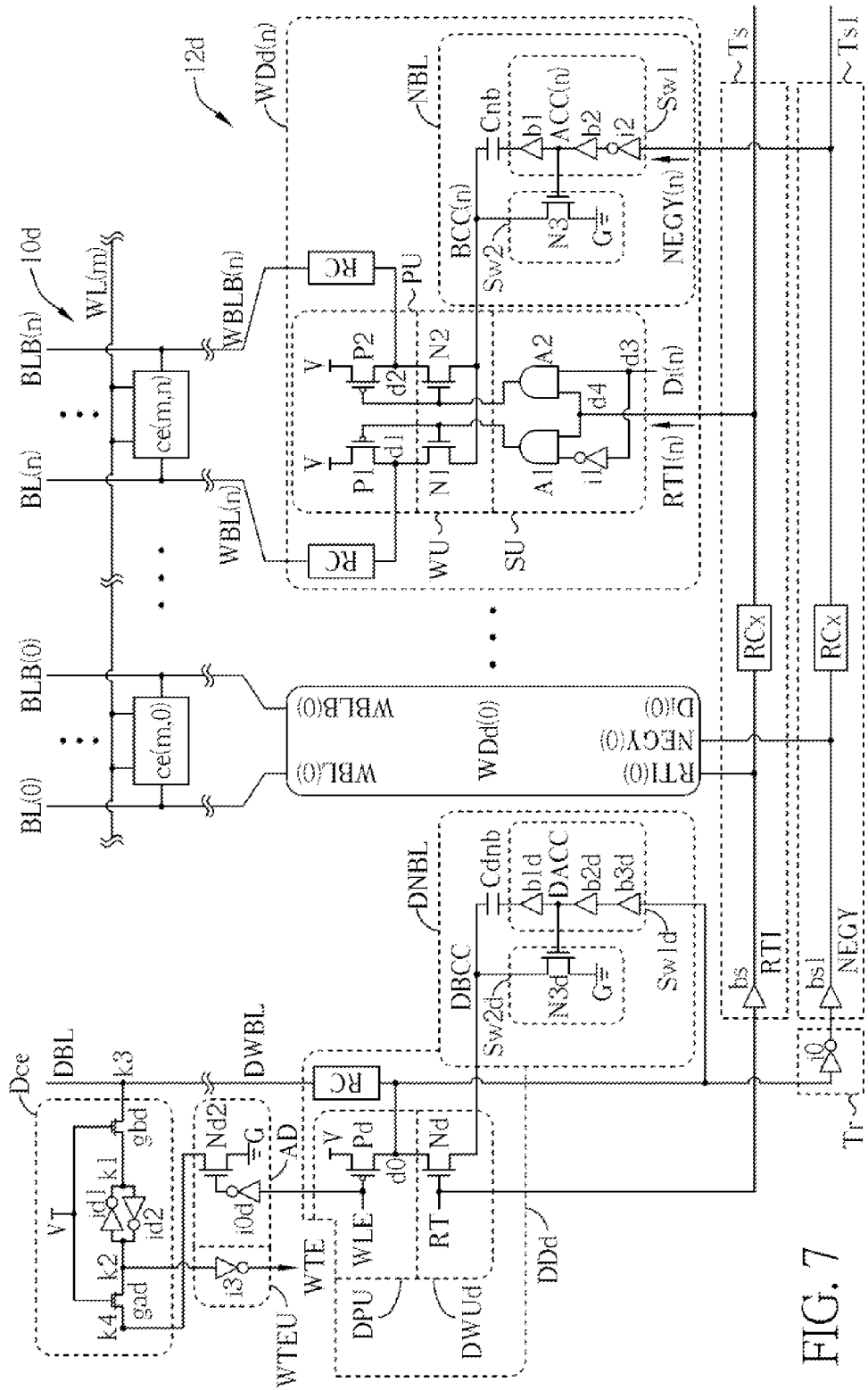
FIG. 7 illustrates a circuit according to another embodiment of the invention.

Following the embodiment of FIG. 1, FIG. 7 illustrates a memory 10d according to still another embodiment of the invention. In a writing system 12d of the memory 10d, each normal writing circuit WDd(n) is coupled to the cell ce(m,n) through the normal write bit-lines WBL(n)/WBLB(n) and the bit-lines BL(n)/BLB(n), so the write data Di(n) can be written into the cell ce(m,n) under timing control of the write control signal RTI(n) and the negative pulse control signal NEGY(n).

The normal writing circuit WDa(n) of FIG. 1 can be adopted to construct the normal writing circuit WDd(n) of FIG. 7.

In addition to the dummy replica bit-line DBL, the dummy replica write bit-line DWBL and the corresponding dummy replica writing circuit DDd, the writing system 12d further includes a dummy replica negative pulse supplier DNBL, an auxiliary circuit AD and a write ending controller WTEU; also, a representative dummy replica cell Dce coupled to the dummy replica bit-line DBL is referred to as an indication cell. In FIG. 7, the memory 10d can be an SRAM of 6T cell, so the dummy replica cell Dce is also a 6T cell which includes a pair of inverters id1 and id2, and a pair of n-channel MOS transistors gad and gbd which are pass-gate transistors. The transistor gad is coupled between nodes k4 and k2, the transistor gbd is coupled to the inverters id1 and id2 at the node k1, and coupled to the dummy replica bit-line DBL at the node k3; gates of these two pass-gate transistors are coupled to the power voltage V. In the dummy replica writing circuit DDd, the p-channel MOS transistor Pd of the dummy replica pre-charge circuit has its gate controlled by the word-line timing signal WLE, and the n-channel MOS transistor Nd in the dummy replica write driver DWUd has its gate controlled by the write control signal RT and its source, the bias node, coupled to the node DBCC of the dummy replica negative pulse supplier DNBL.

The dummy replica negative pulse supplier DNBL can be a replica of the negative pulse supplier NBL in each normal writing circuit WDd(n), so the dummy replica negative pulse supplier DNBL also includes switch circuits Sw1d, Sw2d and a capacitor Cdnb. The switch circuit Sw1d includes buffers b1d to b3d for emulating the buffers b1, b2 and the inverters i2 and i0 corresponding to the switch circuit Sw1; the switch circuit Sw2d has an n-channel MOS transistor N3d which preferably matches the transistor N3 of the switch circuit Sw2. Similar to operation of the negative pulse supplier NBL, the dummy replica negative pulse supplier DNBL is coupled to the dummy replica write bit-line DWBL and the bias node (the node DBCC) of the dummy replica write driver DWUd, so as to alternately switch to connect the bias node of the dummy replica write driver DWUd to either one of the ground voltage G and a dummy replica negative pulse voltage. The dummy replica negative pulse voltage provided by the dummy replica negative pulse supplier DNBL can be the same as the negative pulse voltage supplied by the negative pulse supplier NBL, both are below the ground voltage G. In other words, for the dummy replica write bit-line DWBL, the dummy replica negative pulse supplier DNBL duplicates negative pulse operation of the negative pulse supplier NBL for the normal write bit-lines WBL(n) and WBLB(n), such that level transition of the dummy replica write bit-line DWBL emulates that of the normal write bit-lines WBL(n)/WBLB(n) closely.

In the writing system 12d, the auxiliary circuit AD can be implemented by an inverter i0d and an n-channel MOS transistor Nd2; the inverter i0d inverts the word-line timing signal WLE and provides its output to gate of the transistor Nd2, such that the auxiliary circuit AD selects whether to connect the node k4 of the dummy replica cell Dce to the ground voltage G according to the word-line timing signal WLE. When the word-line timing signal is low, the transistor Nd2 in the auxiliary circuit AD turns on, so k4 is connected to the ground voltage G and a logic 0 of low level cab be stored in the node k2 of the dummy replica cell Dce through the pass-gate transistor gad, and a logic 1 of high level can be stored in the node k1; equivalently, an initial data is stored in the dummy replica cell Dce. The write ending controller WTEU can be implemented by an inverter i3, which inverts level of the node k2 to provide a write ending signal WTE. In addition to providing the word-line timing signal WLE and the write control signal RT to control write timing of the normal writing circuit WDd(n) through the negative pulse control signal NEGY of the negative pulse controller Tr, the write control signal RTI(n) of the normal transmission circuit Ts and the negative pulse control signal NEGY(n) of the replica transmission circuit Ts1, the timing control mechanism (not shown) of the memory 10d further controls level transitions of the word-line timing signal WLE and the write control signal RT according to level transition of the write ending signal WTE, so as to end the write operation with level transitions of the word-line timing signal WLE and the write control signal RT. Please refer to FIG. 8 with timing diagrams of waveforms for signals of the memory 10d of FIG. 7.

As previously described, when the word-line timing signal WLE stays in low level, the auxiliary circuit AD writes initial data of logic 1 into node k1 of the dummy replica cell Dce, and the dummy replica write bit-line DWBL is pre-charged to high level. The node DACC of the dummy replica negative pulse supplier DNBL is at high level, the switch circuit Sw2d conducts to pull level of the node DBCC down to the ground voltage G. When writing starts, as the word-line timing signal WLE transits from low level to high level, the write control signal RT also transits from low level to high level. Then, the dummy replica write driver DWUd of the dummy replica writing circuit DDd starts to drive level transition of the dummy replica write bit-line DWBL for writing a dummy data of logic 0 to the node k1 of the dummy replica cell Dce. During writing of the dummy data by discharging the dummy replica write bit-line DWBL from high level to low level, once level of the dummy replica write bit-line DWBL is lowered to low level, level of the node DACC follows to go low; the switch circuit Sw2d is then turned off, so the capacitor Cdnb can provide a dummy replica negative pulse voltage below the ground voltage G to the node DBCC, as shown by the arrows AD2, AD3 and AD4. The dummy replica negative pulse voltage increases voltage difference across source and drain of the pass-gate transistor gbd to enhance its conduction, lower its drain-source turn-on resistance, so level of the node k1 can be rapidly discharged to logic 0 from logic 1.

When the write control signal RT transits from low level to high level, the level transition is reflected to the write control signal RTI(n) transmitted by the normal transmission circuit Ts, then the normal writing circuit WDd(n) is triggered to start writing the write data Di(n) to the cell ce(m,n); after the dummy replica write bit-line DWBL discharges to low level, the negative pulse controller transits the negative pulse control signal NEGY from low level to high level, so the negative pulse control signal NEGY(n) transmitted by the replica transmission circuit Ts1 can control timing of introducing the negative pulse voltage for the normal writing circuit WDd(n), as indicated by the arrow AD1.

Figure 8:
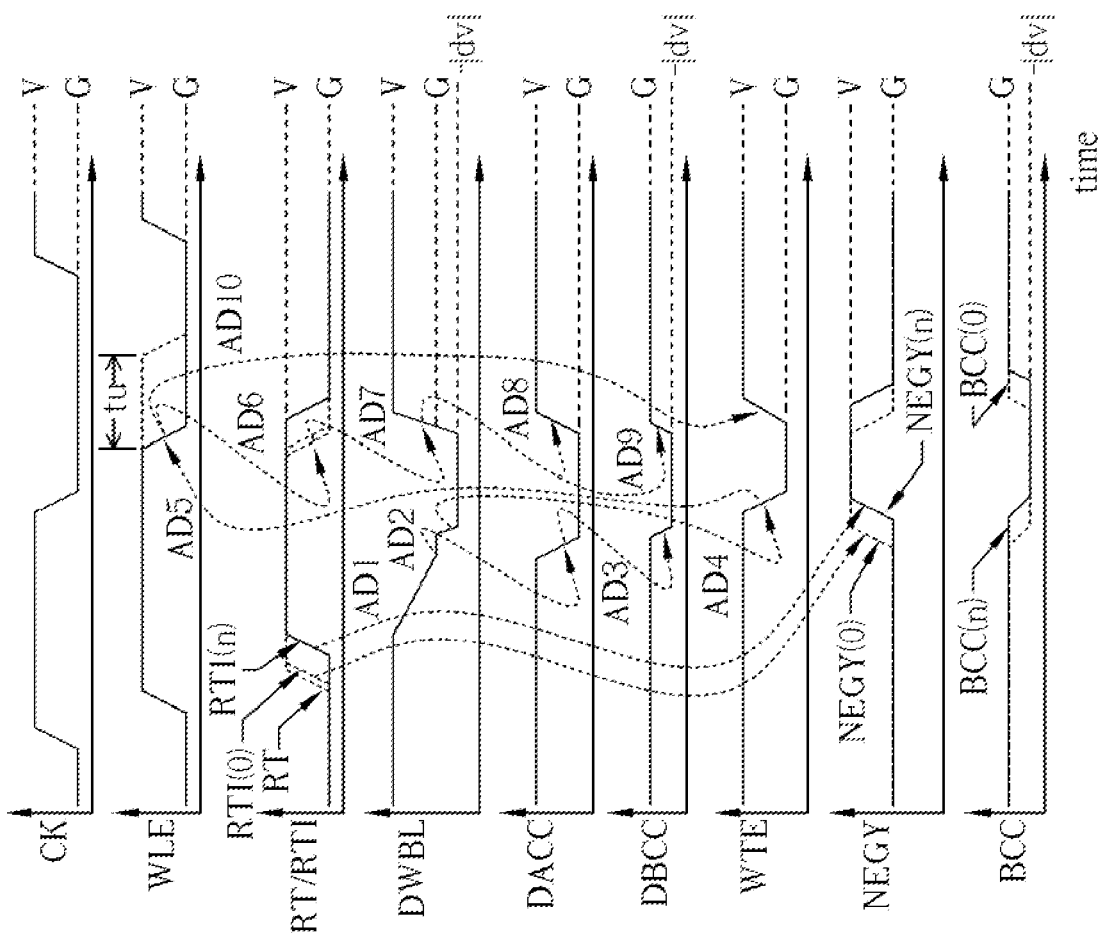
FIG. 8 is a timing diagram illustrating waveforms of signals of the circuit of FIG. 7.

When the initial data of logic 1 at node k1 of the dummy replica cell Dce is discharged to logic 0, data writing is completed; correspondingly, write cycle of the memory 10d can be ended: the write ending signal WTE of the write ending controller WTEU transits from high level to low level, then the timing control mechanism (the word-line timing signal WLE) of the memory 10d can correspondingly transit from high level to low level to end the write operation as soon as possible, as shown by the arrow AD5. In this way, duration of write operation can be shortened to speed up memory operation timing. In FIG. 8, the time interval to represents time saved for write operation; because operations of the dummy replica cell Dce and the dummy replica writing circuit DDd emulate behavior of the normal cell ce(m,n) and the normal writing circuit WDd(n), ending of write operation can be dynamically adjusted following memory operation, there is no need to extend write operation for tolerance of process/operation voltage/temperature variations.

As the word-line timing signal WLE transits from high level to low level, the memory 10d starts bit-line recovery: the write control signals RT, RTI(0) to RTI(n) sequentially transit from high level to low level (the arrow AD6), the dummy replica write bit-line DWBL is pre-charged back to high level (the arrow AD7), the dummy replica negative pulse supplier DNBL switches the node DACC to high level (the arrow AD8), and the node DBCC is conducted to the ground voltage G (the arrow AD9). When the word-line timing signal WLE returns to low level, the auxiliary circuit AD writes the initial data of logic 1 to node k1 of the dummy replica cell Dce, and the write ending signal WTE follows to transit to high level, as shown by the arrow AD10.

To sum up, the invention emulates responses and behaviors of the normal cells, the normal write bit-lines and the normal writing circuits (and their negative pulse supplier) with the dummy replica cell(s), the dummy replica write bit-line(s) and the dummy replica writing circuit, and therefore timing of introducing the negative pulse voltage can be dynamically determined; in addition, the negative pulse supplier can be used to speed up bit-line recovery, and timing of ending the whole write cycle (operation) can be dynamically adjusted for faster write operation, shorter memory operation cycle and higher memory operation frequency. Because a single dummy replica writing circuit is sufficient to control timing of negative pulse voltage for plural normal writing circuits, overhead of implementing negative pulse voltage mechanism can be effectively reduced. Furthermore, embodiment(s) of FIG. 3 and/or FIG. 5 can be combined with embodiment of FIG. 7; for example, the dummy replica negative pulse supplier DNBL and the normal negative pulse supplier NBL of FIG. 7 can be replaced by the negative pulse supplier NBLb of FIG. 3 to combine advantages of FIG. 3 and FIG. 7. Though embodiments of FIGS. 1, 3, 5 and 7 work with SRAMs, the invention can be generalized to other kind of memories, such as registers.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An SRAM writing system comprising:
a dummy replica writing circuit corresponding to at least a dummy replica write bit-line, driving a level transition of the dummy replica write bit-line;
a negative pulse controller coupled to the dummy replica write bit-line, generating a negative pulse control signal according to level of the dummy replica write bit-line; and
at least a normal writing circuit, each normal writing circuit corresponding to at least a normal write bit-line and comprising:
a write driver with a bias node; the write driver connecting the corresponding normal write bit-line to level of the bias node for driving a level transition of the corresponding normal write bit-line; and
a negative pulse supplier coupled to the bias node, alternately connecting the bias node to one of an operation voltage and a negative pulse voltage according to level of the negative pulse control signal; wherein the operation voltage and the negative pulse voltage are different.

2. The SRAM writing system of claim 1, wherein the dummy replica writing circuit selects whether to drive the level transition of the dummy replica write bit-line according to a write control signal, and the SRAM writing system further comprises:
a normal transmission circuit coupled to each normal writing circuit, transmitting the write control signal to each normal writing circuit, wherein each write driver of each normal writing circuit selects whether to connect the corresponding normal write bit-line to the bias node for driving the level transition of the normal write bit-line according to the write control signal transmitted by the normal transmission circuit; and
a replica transmission circuit coupled to each normal writing circuit, transmitting the negative pulse control signal to each negative pulse supplier of each normal writing circuit;
wherein a signal path loading for the normal transmission circuit transmitting the write control signal matches that for the replica transmission circuit transmitting the negative pulse control signal, such that a propagation delay for the negative pulse control signal transmitted to each normal writing circuit tracks that for the write control signal transmitted to each normal writing circuit.

3. The SRAM writing system of claim 1, wherein each negative pulse supplier of each normal writing circuit comprises:
a capacitor having a first node and a second node;
a first switch circuit coupled to the first node, controlling level of the first node according to level of the negative pulse control signal; and
a second switch circuit coupled to the bias node of the write driver and the second node, selecting whether to connect the bias node to the operation voltage according to level of the negative pulse control signal; wherein when the second switch circuit does not connect the bias node to the operation voltage, the negative pulse voltage is provided to the bias node from the second node of the capacitor.

4. The SRAM writing system of claim 3, wherein each negative pulse supplier of each normal writing circuit further comprises:
a delay circuit coupled to the second switch circuit, delaying the level transition of the negative pulse control signal, such that the second switch circuit selects whether to connect the bias node to the operation voltage according to the delayed negative pulse control signal.

5. The SRAM writing system of claim 1, wherein each normal writing circuit corresponds to a pair of normal write bit-lines, and further comprises:
a selection circuit coupled to the write driver, receiving a write data such that the write driver, according to the write data, selects one of the pair of normal write bit-lines and drives the selected normal write bit-line.

6. The SRAM writing system of claim 1, wherein each normal writing circuit further comprises:
a pre-charge circuit coupled to each normal write bit-line corresponding to each normal writing circuit, having a control node and connecting the corresponding normal write bit-line to a second operation voltage to drive the level transition of the corresponding normal write bit-line according to level of the control node; and a selection circuit coupled between the control node and the bias node, selecting whether to connect the control node to the bias node according to level of the write control signal.

7. The SRAM writing system of claim 1, wherein the dummy replica writing circuit selects whether to drive the level transition of the dummy replica write bit-line according to level of a word-line timing signal, and the SRAM writing system further comprises:
   a dummy replica cell coupled to the dummy replica write bit-line through a dummy replica bit-line, storing a corresponding dummy data according to the level of the dummy replica write bit-line; and
   a write ending controller generating a write ending signal according to the dummy data, such that a level transition of the word-line timing signal follows that of the write ending signal.

8. The SRAM writing system of claim 7, wherein the dummy replica writing circuit comprises:
   a dummy replica write driver coupled to the dummy replica write bit-line, having a bias node and connecting the dummy replica write bit-line to the bias node of the dummy replica write driver for driving the level transition of the dummy replica write bit-line;
   and the SRAM writing system further comprises:
   a dummy replica negative pulse supplier coupled to the bias node of the dummy replica write driver, alternately connecting the bias node of the dummy replica write driver to one of the operation voltage and a dummy replica negative pulse voltage according to the level of the dummy replica write bit-line; wherein the operation voltage and the dummy replica negative pulse voltage are different.

9. An SRAM comprising:
   a dummy replica writing circuit corresponding to at least a dummy replica write bit-line, driving a level transition of the dummy replica write bit-line;
   a negative pulse controller coupled to the dummy replica write bit-line, generating a negative pulse control signal according to level of the dummy replica write bit-line; and
   at least a normal writing circuit, each normal writing circuit corresponding to at least a normal write bit-line and comprising:
   a write driver with a bias node; the write driver connecting the corresponding normal write bit-line to a level of the bias node for driving a level transition of the corresponding normal write bit-line; and
   a negative pulse supplier coupled to the bias node, alternately connecting the bias node to one of an operation voltage and a negative pulse voltage according to level of the negative pulse control signal; wherein the operation voltage and the negative pulse voltage are different.

10. The SRAM of claim 9, wherein the dummy replica writing circuit selects whether to drive the level transition of the dummy replica write bit-line according to a write control signal, and the SRAM further comprises:
    a normal transmission circuit coupled to each normal writing circuit, transmitting the write control signal to each normal writing circuit, wherein each write driver of each normal writing circuit selects whether to connect the corresponding normal write bit-line to the bias node for driving the level transition of the normal write bit-line according to the write control signal transmitted by the normal transmission circuit; and
    a replica transmission circuit coupled to each normal writing circuit, transmitting the negative pulse control signal to each negative pulse supplier of each normal writing circuit;
    wherein a signal path loading for the normal transmission circuit transmitting the write control signal matches that for the replica transmission circuit transmitting the negative pulse control signal, such that a propagation delay for the negative pulse control signal transmitted to each normal writing circuit tracks that for the write control signal transmitted to each normal writing circuit.

11. The SRAM of claim 9, wherein each negative pulse supplier of each normal writing circuit comprises:
    a capacitor having a first node and a second node;
    a first switch circuit coupled to the first node, controlling level of the first node according to level of the negative pulse control signal; and
    a second switch circuit coupled to the bias node of the write driver and the second node, selecting whether to connect the bias node to the operation voltage according to level of the negative pulse control signal; wherein when the second switch circuit does not connect the bias node to the operation voltage, the negative pulse voltage is provided to the bias node from the second node of the capacitor.

12. The SRAM of claim 11, wherein each negative pulse supplier of each normal writing circuit further comprises:
    a delay circuit coupled to the second switch circuit, delaying the level transition of the negative pulse control signal, such that the second switch circuit selects whether to connect the bias node to the operation voltage according to the delayed negative pulse control signal.

13. The SRAM of claim 9, wherein each normal writing circuit corresponds to a pair of normal write bit-lines, and further comprises:
    a selection circuit coupled to the write driver, receiving a write data such that the write driver, according to the write data, selects one of the pair of normal write bit-lines and drives the selected normal write bit-line.

14. The SRAM of claim 9, wherein each normal writing circuit further comprises:
    a pre-charge circuit coupled to each normal write bit-line corresponding to each normal writing circuit, having a control node and connecting the corresponding normal write bit-line to a second operation voltage to drive the level transition of the corresponding normal write bit-line according to level of the control node; and
    a selection circuit coupled between the control node and the bias node, selecting whether to connect the control node to the bias node according to level of the write control signal.

15. The SRAM of claim 9, wherein the dummy replica writing circuit selects whether to drive the level transition of the dummy replica write bit-line according to level of a word-line timing signal, and the SRAM further comprises:
    a dummy replica cell coupled to the dummy replica write bit-line through a dummy replica bit-line, storing a corresponding dummy data according to the level of the dummy replica write bit-line; and
    a write ending controller generating a write ending signal according to the dummy data, such that a level transition of the word-line timing signal follows that of the write ending signal.

16. The SRAM of claim 15, wherein the dummy replica writing circuit comprises:
    a dummy replica write driver coupled to the dummy replica write bit-line, having a bias node and connecting the dummy replica write bit-line to the bias node of the dummy replica write driver for driving the level transition of the dummy replica write bit-line;
and the SRAM further comprises:
a dummy replica negative pulse supplier coupled to the bias node of the dummy replica write driver, alternately connecting the bias node of the dummy replica write driver to one of the operation voltage and a dummy replica negative pulse voltage according to the level of the dummy replica write bit-line; wherein the operation voltage and the dummy replica negative pulse voltage are different.

* * * * *